(12) United States Patent  
Stimple et al.

(10) Patent No.: US 7,571,339 B2  
(45) Date of Patent: Aug. 4, 2009

(54) CLOCK RECOVERY SYSTEM WITH TRIGGERED PHASE ERROR MEASUREMENT

(75) Inventors: James R Stimple, Santa Rosa, CA (US); Jady Palko, Windsor, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 490 days.

(21) Appl. No.: 11/407,515

(22) Filed: Apr. 19, 2006

(65) Prior Publication Data

US 2007/0266275 A1 Nov. 15, 2007

(51) Int. Cl.  
*G06F 1/04* (2006.01)
(52) U.S. Cl. ................................. 713/500; 713/503
(58) Field of Classification Search ................ 713/500  
See application file for complete search history.

(56) References Cited

U.S. PATENT DOCUMENTS

| | | | | |
|---|---|---|---|---|
| 5,754,437 A * | 5/1998 | Blazo | | 702/75 |
| 5,789,954 A * | 8/1998 | Toeppen et al. | | 327/158 |
| 5,923,220 A * | 7/1999 | Honma | | 331/17 |
| 6,005,507 A * | 12/1999 | Nakatsu et al. | | 341/155 |
| 6,181,267 B1 | 1/2001 | MacDonald et al. | | |
| 6,374,388 B1 | 4/2002 | Hinch | | |
| 6,608,875 B1 * | 8/2003 | Wolaver | | 375/375 |
| 6,829,295 B2 * | 12/2004 | Chao et al. | | 375/226 |
| 6,977,879 B1 * | 12/2005 | Hamada et al. | | 369/53.34 |
| 7,035,325 B2 * | 4/2006 | Kleck et al. | | 375/226 |
| 7,389,449 B2 * | 6/2008 | Almy et al. | | 714/700 |
| 2005/0058235 A1 * | 3/2005 | Beeson et al. | | 375/376 |
| 2006/0285618 A1 * | 12/2006 | Shoor | | 375/373 |

OTHER PUBLICATIONS

Agilent Technologies, Inc.; U.S. Appl. No. 11/361,603, filed Feb. 24, 2006.  
Agilent Technologies, Inc., U.S. Appl. No. 11/435,476, filed May 17, 2006.  
Agilent Technologies, Inc., U.S. Appl. No. 11/361,603, filed Feb. 24, 2006.  
Agilent Technologies, Inc., U.S. Appl. No. 11/444,734, filed May 31, 2006.

* cited by examiner

*Primary Examiner*—Nitin C Patel  
(74) *Attorney, Agent, or Firm*—John L. Imperato

(57) ABSTRACT

A measurement system includes a clock recovery system and a measurement module coupled to the clock recovery system. The clock recovery system has an associated response characteristic. The clock recovery system receives an input signal and recovers a clock signal from the input signal. The measurement module is coupled to the clock recovery system and measures a phase error signal received from the clock recovery system, time-referenced to a trigger signal that is applied to the measurement module, where the phase error signal represents the phase difference between the input signal and the recovered clock signal. A processor applies the associated response characteristic to the measured phase error signal to determine the phase of the input signal.

20 Claims, 5 Drawing Sheets

CLOCK RECOVERY SYSTEM WITH TRIGGERED PHASE ERROR MEASUREMENT

BACKGROUND OF THE INVENTION

Data signals in many types of high speed digital communication systems are transmitted without an accompanying clock signal. Receivers in these systems typically use clock recovery to extract or "recover" clock signals that are associated with the data signals. In phase-locked-loop (PLL)-based clock recovery systems, a clock signal is recovered from a data signal by locking the phase of an oscillator in the clock recovery system to the phase of edge transitions within the data signal. The recovered clock signals are typically used to provide timing information that enables receivers to accurately sample the data signals.

In a typical measurement application, the clock recovery system is included in a digital communication analyzer (DCA) where the recovered clock signal is used to strobe a sampler, enabling the data signal to be sampled and represented on a display. In other measurement applications, it is advantageous to characterize phase differences between the data signal and the recovered clock signal at time positions established by a trigger signal, to determine the phase error between the recovered clock signal and the data signal, time-referenced to the trigger signal. Time referencing the phase error to a trigger signal would enable the clock recovery system to acquire phase error measurements that are synchronized to external events such as modulation signals that are applied to the data signal. These types of phase error measurements are particularly useful in characterizing performance of phase locked loops and other systems.

Accordingly, there is a need for a clock recovery system that has the capability to measure the phase error between an applied data signal and a recovered clock signal, time-referenced to a trigger signal.

DETAILED DESCRIPTION

Figure 1:
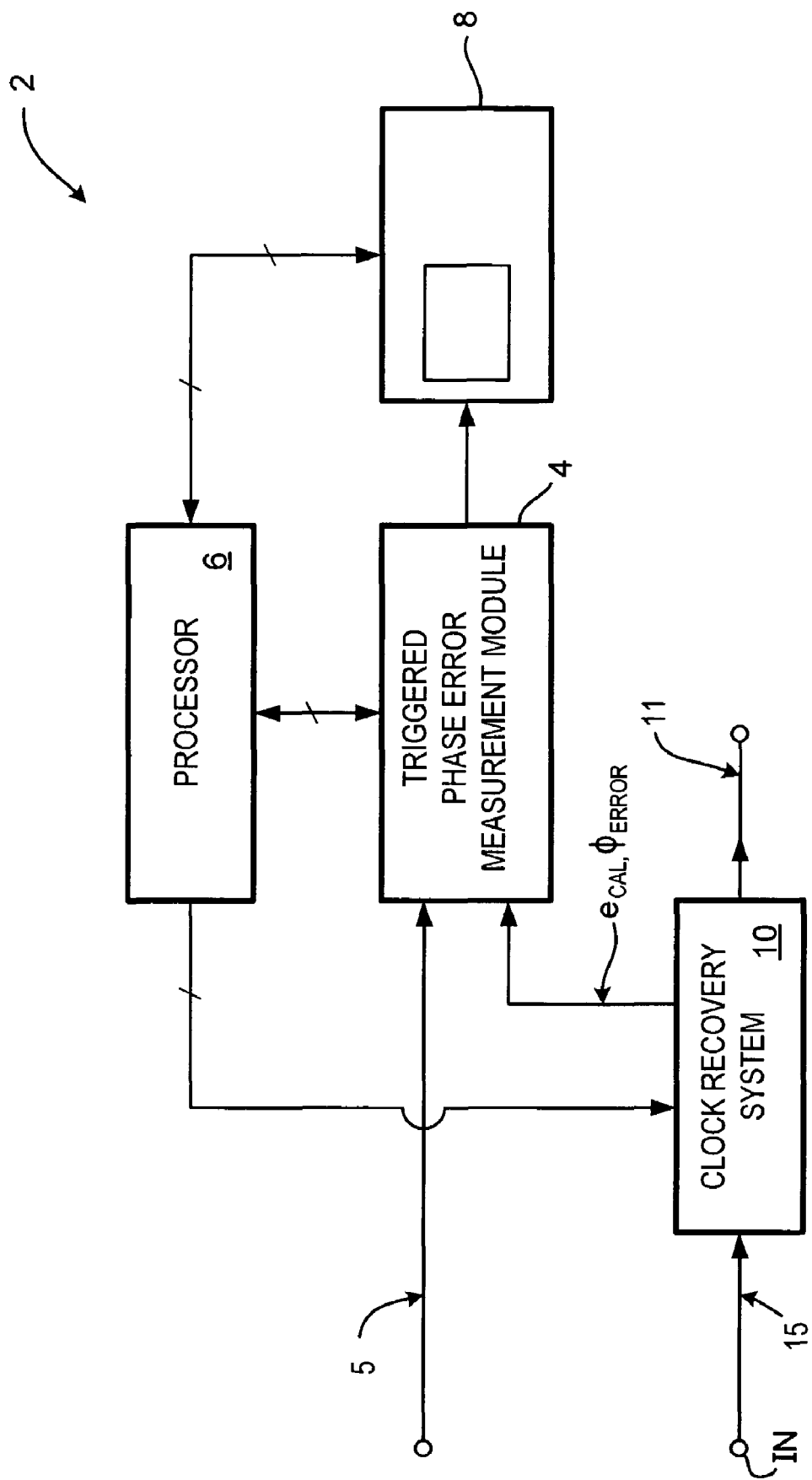
FIG. 1 shows one example of a measurement system that includes a clock recovery system with a triggered phase error measurement module according to embodiments of the present invention.

FIG. 1 shows one example of a measurement system 2 that includes a clock recovery system 10 with triggered phase error measurement capability according to embodiments of the present invention. The clock recovery system 10 receives an input signal 15, typically a data signal or other type of digital signal, and provides a recovered clock signal 11 from the applied input signal 15. A triggered phase error measurement module 4, hereinafter "measurement module 4" is coupled to the clock recovery system 10. The measurement module 4 receives a trigger signal 5 and measures a phase error signal $\phi_{ERROR}$ time-referenced to the trigger signal 5. The phase error signal $\phi_{ERROR}$ represents the phase difference or phase error between the input signal 15 and the recovered clock signal 11. A processor 6 adjusts the measured phase error signal $\phi_{ERROR}$ according to a determined response characteristics of the clock recovery system 10 to represent the phase of the input signal 15 on a display or other output device 8.

Figure 2:
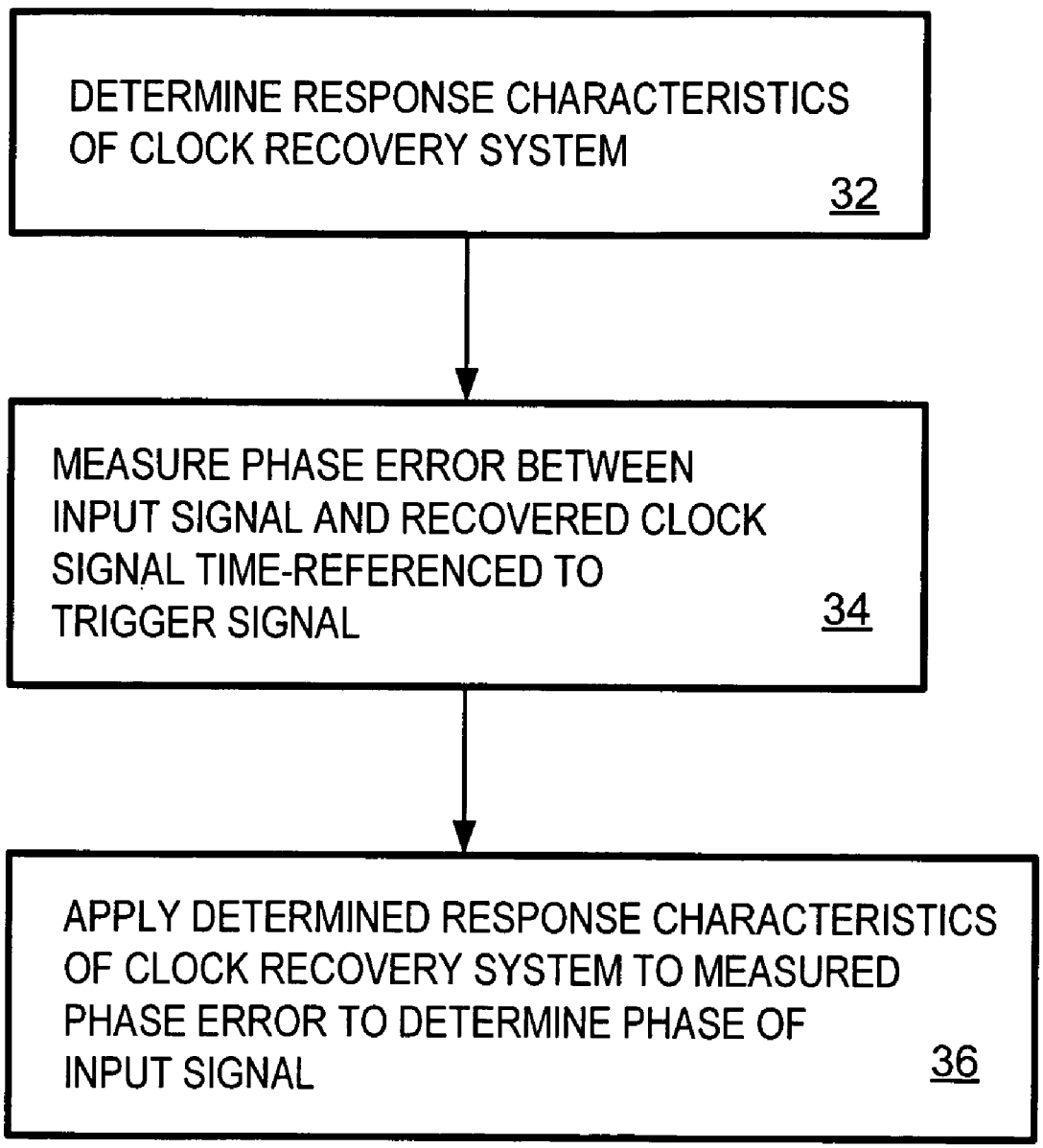
FIG. 2 shows an example of a method of operation for the clock recovery system with the triggered phase error measurement module according to embodiments of the present invention.

A method of operation 30 of the clock recovery system 10 with the measurement module 4 is shown in FIG. 2. The method of operation 30 includes determining the response characteristics of the clock recovery system 10 (step 32), measuring the phase error between the input signal 15 and the recovered clock signal 11, referenced in time to the trigger signal 5 (step 34), and applying the determined response characteristics of the clock recovery system 10 to the measured phase error to determine the phase of the input signal 15 (step 36).

Figure 3:
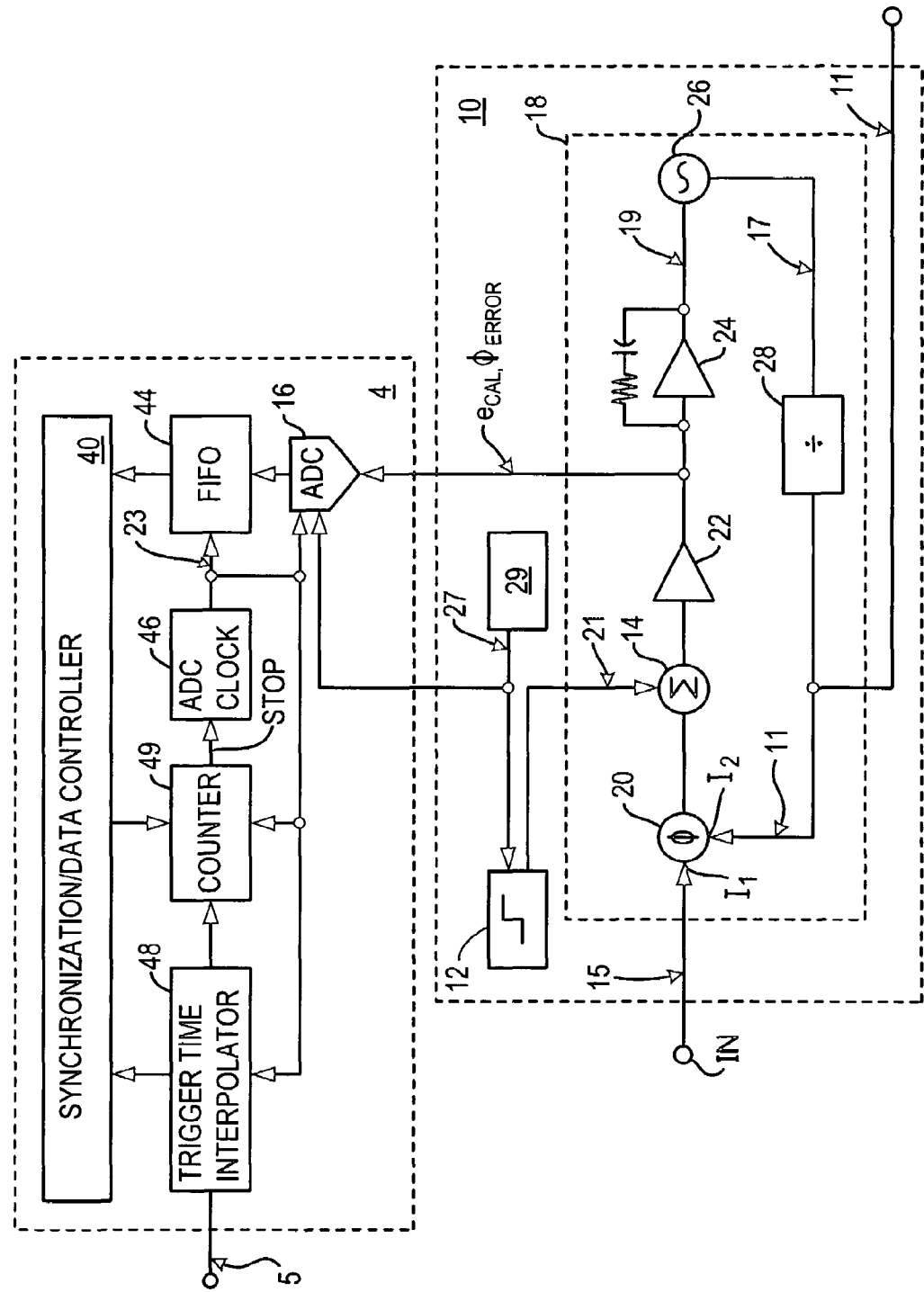
FIG. 3 shows a detailed view of the clock recovery system with the triggered phase error measurement module according to embodiments of the present invention.

Operation of the clock recovery system 10 and the determination of the response characteristics of the clock recovery system 10 according to step 32 are described in the context of FIG. 3, which shows an example of a detailed view of the clock recovery system 10. The clock recovery system 10 includes a signal source 12 and a signal summer 14 that is interposed within a phase-locked loop (PLL) 18. The PLL 18 in this example includes a phase detector 20, an error amplifier 22, a loop integrator 24, a voltage-controlled oscillator (VCO) 26 and a frequency divider 28. The PLL 18 is shown in block diagram form for the purpose of illustration. One example of a PLL 18 suitable for inclusion in the clock recovery system 10 is included in a model 83495 Clock Recovery Module provided by Agilent Technologies, Inc, of Palo Alto, Calif., USA. Alternative types of PLLs 18 that are suitable for recovering clock signals 11 from applied input signals 15 are included in alternative examples of the clock recovery system 10. An ADC 16, included in the measurement module 4, is shown coupled to a signal path between the signal summer 14 and the loop integrator 24 in the PLL 18.

Under phase-locked conditions, the PLL 18 included in the clock recovery system 10 operates in a conventional manner to provide a recovered clock signal 11 that is a frequency-divided version of a signal 17 provided by the VCO 26. The phase detector 20 provides a phase error signal $\phi_{ERROR}$ that is present at the output of the error amplifier 22. The phase error signal $\phi_{ERROR}$ represents phase errors between the applied input signal 15 and the recovered clock signal 11. The phase error signal $\phi_{ERROR}$ is applied to the loop integrator 24 which provides a drive signal 19 to the VCO 26 that adjusts the frequency of the VCO 26 to minimize the phase error signal $\phi_{ERROR}$. The PLL 18 minimizes the phase error signal $\phi_{ERROR}$ to the extent that the PLL 18 has sufficient gain and bandwidth to track signal fluctuations, or jitter, in the input signal 15. However, due to inherent gain and bandwidth limitations of the PLL 18, and performance limitations of the phase detector 20, the phase of the clock signal 11 provided to an input $I_2$ of the phase detector 20 fails to track high frequency fluctuations in the phase of the input signal 15. Deviation in the tracking between the phase of the clock signal 11 and the phase of the input signal 15, or phase error, depends on response characteristics, such as the loop gain and loop bandwidth of the PLL 18 within the clock recovery system 10. Typically, the loop gain and the bandwidth are represented by response characteristics of the clock recovery system 10, such as the impulse response or the frequency transfer function of the clock recovery system 10.

Determining the response characteristics of the clock recovery system 10 according to step 32 of the method of operation 30 includes injecting a stimulus signal 21 into the signal summer 14 interposed between the phase detector 20 and the loop integrator 24 of the PLL 18. The stimulus signal 21 is injected into the signal summer 14 with the input signal 15 applied to a first input $I_1$ of the phase detector 20 with the PLL 18 in a phase-locked state. In one example, the stimulus signal 21 is a step signal that is provided by the signal source 12. In alternative examples, the stimulus signal 21 is an impulse signal, a swept-frequency signal, or any other signal suitable for application to the signal summer 14 that has sufficient bandwidth or frequency span to adequately characterize the response characteristics of the clock recovery system 10 to injection of the stimulus signal 21 into the signal summer 14.

Determining response characteristics of the clock recovery system 10 according to step 32 also includes measuring a calibration error signal $e_{CAL}$ at the output of the error amplifier 22 with the stimulus signal 21 injected into the signal summer 14 with the input signal 15 applied to the first input $I_1$ of the phase detector 20, and with the PLL 18 in a phase-locked state. The calibration error signal $e_{CAL}$ is measured by the ADC 16 with the measurements that are synchronized or otherwise time-referenced to the stimulus signal 21, typically by strobing the ADC 16 and the signal source 12 with a common synchronization signal 27 that is provided by a timing generator 29, as shown in FIG. 3. In the example where the stimulus signal 21 is a step signal, the measurements of the calibration error signal $e_{CAL}$ that are acquired by the ADC 16 are synchronized to the rising edge of the step signal by the synchronization signal 27. In alternative examples, the measurements of the calibration error signal $e_{CAL}$ acquired by the ADC 16 are time-referenced by coupling a second analog-to-digital converter (not shown) to the output of the signal source 12 to measure the stimulus signal 21 that is provided by the signal source 12. The ADC 16 and the second analog-to-digital converter are then strobed by a common timing signal (not shown) so that the measurements of the stimulus signal 21 acquired by the second analog-to-digital converter can be used to designate a time position of the stimulus signal 21 to which measurements of the calibration error signal $e_{CAL}$ by the ADC 16 are time-referenced.

The measured calibration error signal $e_{CAL}$ is processed, typically by a processor 6 that is in signal communication with the ADC 16, to determine the response characteristics of the clock recovery system 10 between the input IN of the clock recovery system 10 and the position in the signal path of the clock recovery system 10 to which the ADC 16 is coupled. Typically, the response characteristic of interest is the impulse response between the input IN and the ADC 16, or the frequency transfer function between the input IN and the ADC 16. For clarity, signal paths connecting the processor 6 to elements within the clock recovery system 10 and the measurement module 4 as shown in FIG. 1, are omitted in FIG. 3.

Figure 4A:
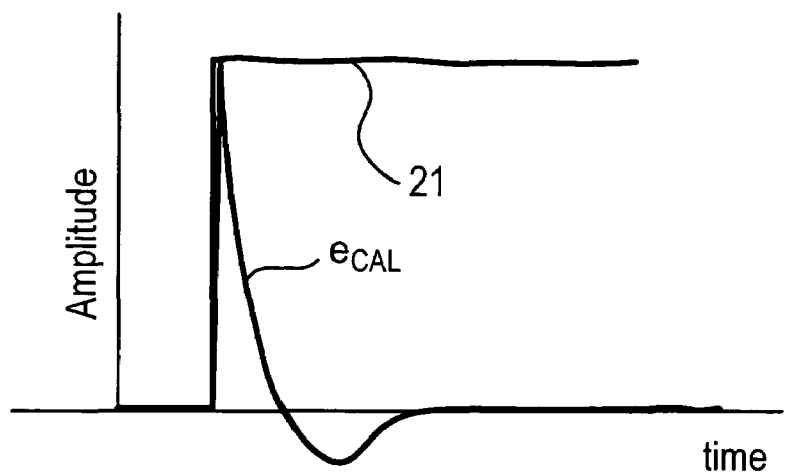
FIGS. 4A-4C show examples of response characteristics for the clock recovery system included in FIG. 3.
Figure 4B:
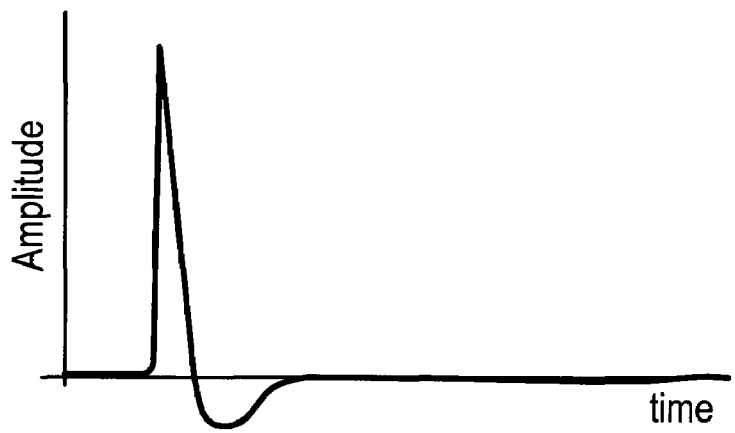
Figure 4C:
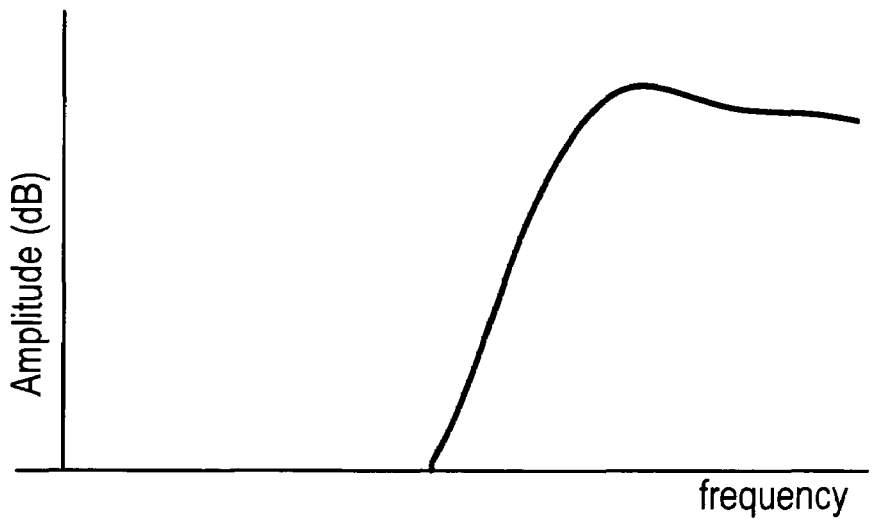

In an example where the stimulus signal 21 is a step signal, the calibration error signal $e_{CAL}$ measured by the ADC 16 represents the step response of the clock recovery system 10 from the signal summer 14 to the output of the error amplifier 22. FIG. 4A shows an example of the measured calibration error signal $e_{CAL}$ superimposed on the step signal 21. The derivative of the step response shown in FIG. 4A provides the impulse response of the clock recovery system 10. An example of the impulse response from the input IN to the ADC 16 is shown in FIG. 4B. The frequency transfer function if the clock recovery system 10 from the input IN to the ADC 16 can also be provided by taking the Fourier Transform of the impulse response. One example of the frequency transfer function is shown in FIG. 4C.

In an example where the stimulus signal 21 is an impulse signal, the calibration error signal $e_{CAL}$ measured by the ADC 16 provides the impulse response of the clock recovery system 10. Typically, the bandwidth of the phase detector 20, the signal summer 14, and the error amplifier 22 are sufficiently wider than the bandwidth of the PLL 18 in the clock recovery system 10, so that the response characteristics of the clock recovery system 10 are primarily established by the loop integrator 24 and other components of the clock recovery system 10. According to alternative implementations of step 32, the response characteristics associated with the clock recovery system 10 are determined by estimating or calculating the impulse response or the frequency transfer function of the clock recovery system 10 based on analysis or computer modeling of the particular PLL 18 that is included in the clock recovery system 10.

Step 34 of the method of operation 30 includes measuring the phase error signal $\phi_{ERROR}$, time-referenced to the trigger signal 5, where the phase error signal $\phi_{ERROR}$ represents the phase error between the input signal 15 and the recovered clock signal 11. In step 34, the signal source 12 does not inject a stimulus signal 21 to the signal summer 14 and the output of the phase detector 20 is provided to the error amplifier 22. In step 34, the input signal 15 is applied to the input $I_1$ of the phase detector 20, the clock signal 11 recovered from the input signal 15 is applied to the input $I_2$ of the phase detector 20, and the PLL 18 is in a phase locked state.

Step 34 is described in the context of FIG. 3, which shows an example of a detailed view of the measurement module 4. The measurement module 4 includes the ADC 16 and a FIFO 44 that receives data from the ADC 16. The FIFO 44 is coupled to a synchronization/data controller 40 and the FIFO 44 and the ADC 16 are clocked by an ADC clock 46. A trigger time interpolator 48 receives the trigger signal 5 that is applied to the measurement module 4. The trigger time interpolator 48 is coupled to a counter 49 and to the synchronization/data controller 40.

To measure the phase error signal $\phi_{ERROR}$, the ADC 16 acquires a set of samples of the phase error signal $\phi_{ERROR}$ at the output of the error amplifier 22. The samples in the set are timed according to the ADC clock 46. Each sample in the set has a value that represents the amplitude of the phase error signal $\phi_{ERROR}$, and each sample in the set has an associated index that represents the number of the sample within the set.

The samples acquired by the ADC 16 are loaded into the FIFO 44 until the registers of the FIFO 44 are filled. Once the registers are filled, prior samples acquired by the ADC 16 that were loaded into the FIFO 44 are shifted out of the FIFO 44 and discarded. The synchronization/data controller 40 establishes the number of samples that are acquired by the ADC 16 after a trigger event, such as a rising edge, falling edge, or other designated attribute of the trigger signal 5. The synchronization/data controller 40 also establishes the number of samples that should be positioned prior to the trigger event relative to the number of samples that should be positioned after the trigger event. This positioning of acquired samples relative to the trigger event is typically established via the processor 6 and is typically based on a user input or other designation for the relative positioning of samples acquired by the ADC 16.

The synchronization/data controller 40 loads into the counter 49 the number that designates how many samples are positioned after the trigger event, and then the synchronization/data controller 40 arms the trigger time interpolator 48.

Upon the occurrence of a trigger event, the trigger time interpolator 48 initiates a count by the counter 49 to count down from the number previously loaded into the counter 49 by the synchronization/data controller 40. Upon completion of the count, the counter 49 provides a stop signal STOP to the ADC clock 46, which stops the acquisition of samples by the ADC 16. Absent the provided stop signal STOP, the ADC clock 46 clocks the ADC 16 and the FIFO 44.

The trigger time interpolator 48 measures the time interval or the fraction of a cycle of a signal 23 provided by the ADC clock 46 that occurs between the trigger event and the next cycle of the signal 23. Based on the number loaded into the counter 49 and the fraction of the cycle of the signal 23 measured by the trigger time interpolator 48, the trigger event can be positioned within the set of samples that are acquired by the ADC 16. Absolute time positions of the acquired samples are then established relative to the trigger event based on the period of the signal 23 provided by the ADC clock 46, the number loaded into the counter 49 and the fraction of the cycle of the signal 23 measured by the trigger time interpolator 48. Acquiring samples of the phase error signal $\phi_{ERROR}$ relative to trigger events designated in the trigger signal 5 enables multiple sets of samples to be acquired and averaged to remove any components of the phase error signal $\phi_{ERROR}$ that are not synchronous with the trigger signal 5. Typically, averaging the multiple sets of samples includes averaging samples in each of the sets of samples that have corresponding indices. For example, the sample in a first acquired set with the first index is averaged with the samples in the other acquired sets that have the first index, the sample in the first acquired set with the second index is averaged with the samples in the other acquired sets that have the second index, and so on.

One example of a system that is suitable for acquiring samples with an ADC, where the samples are then positioned in time relative to a trigger event is provided in a sampling oscilloscope, such as a DSO model 3102A Oscilloscope, provided by AGILENT TECHNOLOGIES, INC., of Palo Alto, Calif., USA.

Step 36 of the method of operation 30 shown in FIG. 2 includes applying the response characteristics of the clock recovery system 10 determined in step 32 to the phase error signal $\phi_{ERROR}$ measured in step 34 to determine the phase of the input signal 15. In an example wherein the impulse response from the input IN of the clock recovery system 10 to the position in the signal path of the clock recovery system 10 to which the ADC 16 is coupled is determined in step 32, the phase of the input signal 15 is determined in step 36 by a deconvolution of the phase error signal $\phi_{ERROR}$ with the determined impulse response. In an example wherein the frequency transfer function from the input of the clock recovery system 10 to the position in the signal path of the clock recovery system 10 to which the ADC 16 is coupled is determined in step 32, the phase of the input signal 15 is determined in step 36 by an inverse Fourier Transform of the ratio of a Fourier Transform of the measured phase error signal $\phi_{ERROR}$ to the determined frequency transfer function.

Figure 5:
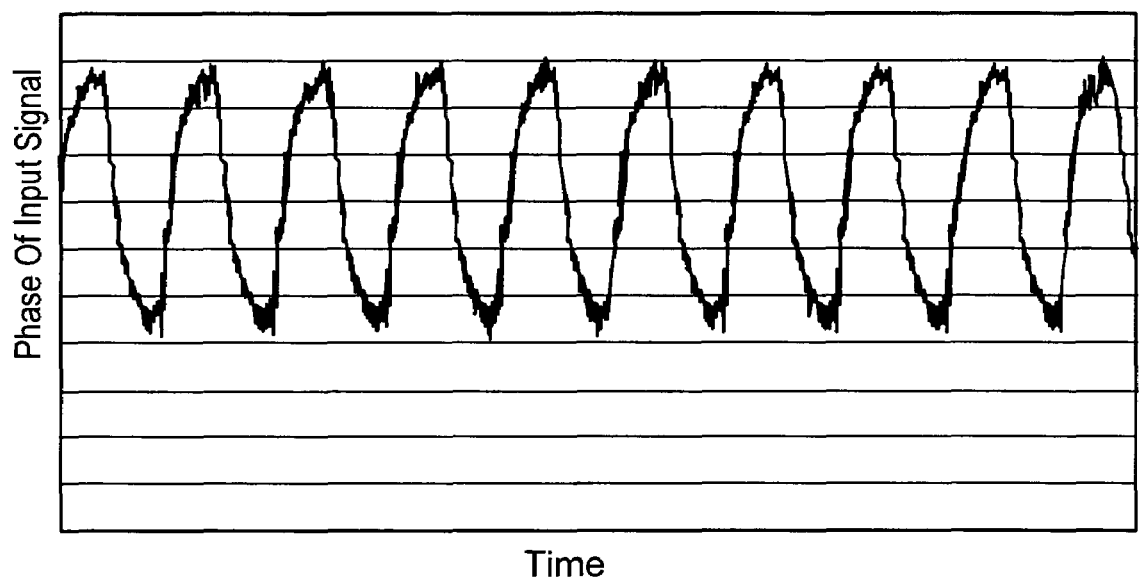
FIG. 5 shows an example of the phase of an applied input signal versus time, determined using the measurement system shown in FIG. 1.

FIG. 5 shows one example of the phase of the applied input signal 15 versus time, determined using the measurement system 2 shown in FIG. 1. In this example, the input signal 15 is a periodically modulated data signal, where the trigger signal 5 is derived from a modulating signal that periodically modulates the data signal. Samples of the phase error signal $\phi_{ERROR}$ are acquired and referenced in time to trigger events designated in the trigger signal 5. Time-referencing the acquired samples to the trigger signal 5 enables multiple sets of samples to be acquired and averaged to reduce or remove any components of the phase error signal $\phi_{ERROR}$ that are not synchronous with the trigger signal 5. In one example, noise present on the representation of the phase of the input signal 15 as shown in FIG. 5, can be reduced by acquiring multiple sets of samples of the measured phase error signal $\phi_{ERROR}$ and averaging the multiple sets of samples in step 34, and then applying the determined response characteristics of the clock recovery system 10 to the average of the multiple sets of samples in step 36.

While the embodiments of the present invention have been illustrated in detail, it should be apparent that modifications and adaptations to these embodiments may occur to one skilled in the art without departing from the scope of the present invention as set forth in the following claims.

The invention claimed is:

1. A measurement system, comprising:
   a clock recovery system having an associated response characteristic, receiving an input signal having an amplitude and a phase and recovering a clock signal from the input signal;
   a measurement module coupled to the clock recovery system, measuring a phase error signal to provide a measured phase error signal, the phase error signal received from the clock recovery system that represents a phase error between the input signal and the recovered clock signal; and
   a processor applying the associated response characteristic of the clock recovery system to the measured phase error signal to determine the phase of the input signal.

2. The measurement system of claim 1 in which the clock recovery system includes a signal summer having a first input receiving a phase detected signal provided by a phase detector within a phase locked loop (PLL), and a signal source coupled to a second input of the signal summer selectively providing a stimulus signal to the signal summer.

3. The measurement system of claim 2 in which the measurement module includes an analog-to-digital converter (ADC) coupled to a signal path between the signal summer and a loop integrator within the PLL.

4. The measurement system of claim 3 in which the ADC measures a calibration error signal in the signal path with the signal source providing the stimulus signal to the signal summer, with the input signal applied to the phase detector, and with the PLL in a phase locked state, wherein the calibration error signal is processed to provide the response characteristic associated with the clock recovery system.

5. The measurement system of claim 4 in which the stimulus signal includes at least one of a step signal and an impulse signal.

6. The measurement system of claim 4 in which the response characteristic associated with the clock recovery system includes at least one of an impulse response of the clock recovery system and a frequency transfer function of the clock recovery system.

7. The measurement system of claim 2 in which the response characteristic associated with the clock recovery system includes at least one of an impulse response of the clock recovery system and a frequency transfer function of the clock recovery system.

8. The measurement system of claim 3 in which the ADC measures the phase error signal in the signal path, time-referenced to a trigger signal applied to the measurement module, with the input signal applied to the phase detector at an input to the PLL and the recovered clock signal applied to the phase detector from a feedback path of the PLL.

9. The measurement system of claim 8 in which the trigger signal is derived from a modulating signal that modulates the input signal.

10. The measurement system of claim 9 in which the response characteristic associated with the clock recovery system includes at least one of an impulse response of the clock recovery system and a frequency transfer function of the clock recovery system.

11. The measurement system of claim 10 in which the processor deconvolves the measured phase error signal with the impulse response of the clock recovery system when the response characteristic associated with the clock recovery system is the impulse response of the clock recovery system.

12. The measurement system of claim 10 in which the processor determines an inverse Fourier Transform of the ratio of a Fourier Transform of the measured phase error signal to the frequency transfer function when the response characteristic associated with the clock recovery system is the frequency transfer function of the clock recovery system.

13. The measurement system of claim 8 in which the ADC measures the phase error signal by acquiring multiple sets of samples of the phase error signal and averaging the samples in each of the multiple sets of samples that have corresponding indices.

14. A measurement system, comprising:
    a clock recovery system having an associated response characteristic, receiving an input signal having an amplitude and a phase and recovering a clock signal from the input signal;
    a measurement module coupled to the clock recovery system, measuring a phase error signal time-referenced to a trigger signal to provide a measured phase error signal, the trigger signal applied to the measurement module, where the phase error signal is received from the clock recovery system and represents a phase difference between the input signal and the recovered clock signal; and
    a processor applying the associated response characteristic to the measured phase error signal to determine the phase of the input signal.

15. The measurement system of claim 14 in which measuring the phase error signal time-referenced to the trigger signal includes acquiring at least one set of samples of the phase error signal with an analog-to-digital converter (ADC) included in the measurement module.

16. The measurement system of claim 14 in which measuring the phase error signal includes acquiring multiple sets of samples of the phase error signal with an analog-to-digital converter (ADC) included in the measurement module, and averaging the samples in each of the multiple sets of samples that have corresponding indices.

17. The measurement system of claim 14 in which applying the associated response characteristic to the measured phase error signal to determine the phase of the input signal includes deconvolving the measured phase error signal with an impulse response of the clock recovery system when the response characteristic associated with the clock recovery system is the impulse response of the clock recovery system.

18. The measurement system of claim 17 in which the impulse response is derived from a step response of the clock recovery system.

19. The measurement system of claim 14 in which the response characteristic associated with the clock recovery system is a frequency transfer function of the clock recovery system, and wherein applying the associated response characteristic to the measured phase error signal to determine the phase of the input signal includes determining an inverse Fourier Transform of the ratio of a Fourier Transform of the measured phase error signal to the frequency transfer function.

20. The measurement system of claim 14 in which the associated response characteristic of the clock recovery system is determined by selectively injecting a stimulus signal into a signal summer interposed between a phase detector and a loop integrator of a phase-locked loop (PLL) within the clock recovery system, with a data signal applied to a first input of the phase detector and with the PLL in a phase locked state, by measuring a calibration error signal in a signal path of the PLL between the signal summer and the loop integrator when the stimulus signal is injected into the signal summer, and by processing the measured calibration error signal to determine the associated response characteristic of the clock recovery system.

* * * * *